(12) United States Patent
Fujiki et al.

(10) Patent No.: US 7,504,907 B2
(45) Date of Patent: Mar. 17, 2009

(54) MULTILAYER DIRECTIONAL COUPLER

(75) Inventors: Yasuhiro Fujiki, Phoenix, AZ (US); Kosuke Ishida, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/941,216

(22) Filed: Nov. 16, 2007

(65) Prior Publication Data

US 2008/0062723 A1 Mar. 13, 2008

Related U.S. Application Data

(63) Continuation of application No. PCT/JP2006/307094, filed on Apr. 4, 2006.

(30) Foreign Application Priority Data

May 20, 2005 (JP) .............................. 2005-148725

(51) Int. Cl.
*H01P 5/18* (2006.01)
(52) U.S. Cl. ...................... 333/112; 333/116
(58) Field of Classification Search ................. 333/112, 333/116, 118
See application file for complete search history.

(56) References Cited

U.S. PATENT DOCUMENTS

| 5,359,304 A | 10/1994 | Fujiki |
| 5,369,379 A | 11/1994 | Fujiki |
| 5,745,981 A * | 5/1998 | Roshen et al. ................ 29/607 |
| 6,515,556 B1 | 2/2003 | Kato et al. |

FOREIGN PATENT DOCUMENTS

| JP | 04-355904 A | 12/1992 |
| JP | 05-135951 A | 6/1993 |
| JP | 05-258977 A | 10/1993 |
| JP | 08-306532 A | 11/1996 |
| JP | 09-139315 A | 5/1997 |
| JP | 11-054336 A | 2/1999 |
| JP | 2002-330008 A | 11/2002 |
| JP | 2003-168904 A | 6/2003 |
| JP | 2004-015281 A | 1/2004 |
| JP | 2005-151179 A | 6/2005 |

OTHER PUBLICATIONS

Official communication issued in the International Application No. PCT/JP2006/307094, mailed on Jun. 27, 2006.
Ellis; "RF Directional Couplers"; Electronic System Products, Search on May 20, 2005, Internet, http:/members.tripod.com/michaelgellis/direct.html.

* cited by examiner

*Primary Examiner*—Benny Lee
(74) *Attorney, Agent, or Firm*—Keating & Bennett, LLP

(57) ABSTRACT

A multilayer directional coupler which is easy to mass-produce and reduce in size, in which fine setting of the degree of electromagnetic coupling is facilitated, and which has a large bandwidth ratio, includes magnetic substrates, a laminate including first and second transformers, and external electrodes. One external electrode, which is connected to two ends of a primary coil of the first transformer, defines an input end for a main signal, and another external electrode defines an output end. A further external electrode, which is connected to two ends of a secondary coil of the second transformer, defines an output end for a sub-signal. A winding length ratio N1 of the secondary coil to primary coil of the first transformer and a winding length ratio N2 of the primary coil to secondary coil of the second transformer are each set to a value that is greater than about 1 and not greater than about 10. A ratio of the winding length ratio N2 to the winding length ratio N1 is greater than about 0.5 and less than about 2.0.

3 Claims, 7 Drawing Sheets

MULTILAYER DIRECTIONAL COUPLER

BACKGROUND OF THE INVENTION

1. Field of the Invention

The present invention relates to a multilayer directional coupler used in a mobile communication apparatus such as a cellular phone or the like.

2. Description of the Related Art

Multilayer directional couplers include, for example, the technologies disclosed in Japanese Unexamined Patent Application Publication No. 05-152814 and Japanese Unexamined Patent Application Publication No. 05-160614. These directional couplers have a structure in which strip-line transmission lines, each having a length of a quarter wavelength or less than a quarter wavelength, are laminated and formed in a dielectric substrate. On the basis of this structure, these directional couplers can be easily mass-produced and reduced in size. Accordingly, these multilayer directional couplers are widely used in mobile communication apparatuses, etc.

However, in these directional couplers, a bandwidth at which a stable degree of electromagnetic coupling can be obtained is represented by a bandwidth ratio of 50% or less. Therefore, these multilayer directional couplers cannot be used in apparatuses that need a signal having a bandwidth ratio of 90% or greater, such as a television signal.

Another known directional coupler, as shown in FIGS. 14 and 15, is capable of realizing a band with ratio of 99% or greater.

As shown in FIG. 14, this directional coupler 100 is constructed by winding an electrode 102 around a binocular-shaped magnetic core 101, and its circuit configuration is as shown in FIG. 15.

In this configuration, by appropriately setting a winding ratio (a ratio of the numbers of turns) N1 of a coil 112 to coil 111 of a transformer 110, and appropriately setting a winding ratio (a ratio of the numbers of turns) N2 of a coil 121 to coil 122 of a transformer 120, for example, a main signal input from a port 110a (port 110b) of the transformer 110 can be output to a port 110b (port 110a) and a port 120a (port 120b) of the transformer 120 at a distribution ratio corresponding to the winding ratios.

However, since, as shown in FIG. 14, for the directional coupler 100, an operation of manually winding the electrode 102 around the magnetic core 101 is needed, mass productivity is low compared with the above multilayer directional couplers. In addition, this type of directional coupler needs at least a volume of 80 mm$^3$, and is accordingly not suitable in terms of size reduction. In addition, with the directional coupler 100, it is difficult to finely and accurately set the degree of electromagnetic coupling between the transformers because the degree of electromagnetic coupling between the transformers must be set on the basis of a winding ratio (a ratio of the numbers of turns) of the electrode 102. Accordingly, a main signal input to the port 110a (the port 110b) may not be output to the port 110b (the port 110a) and the port 120a (the port 120b) of the transformer 120 at a desired distribution ratio.

SUMMARY OF THE INVENTION

In order to overcome the problems described above, preferred embodiments of the present invention provide a multilayer directional coupler that is easy to mass-produce and reduce in size, in which fine setting of the degree of electromagnetic coupling is facilitated, and which has a large bandwidth ratio.

A multilayer directional coupler according to a preferred embodiment of the present invention includes a first magnetic substrate, a laminate laminated on the first magnetic substrate, first and second transformers provided in the laminate, and a second magnetic substrate provided on the laminate. Two ends of a primary coil of the first transformer defines input and output terminals for a main signal, one end of a secondary coil of the first transformer defines a ground terminal, and the other end of the secondary coil is connected to one terminal of a secondary coil of the second transformer. One end of a primary coil of the second transformer is connected to one terminal of the first transformer, the other end of the primary coil of the second transformer is connected to the ground terminal, and one terminal of the secondary coil of the second transformer is used as an output terminal for outputting a sub-signal. The winding length ratio N1 of the secondary coil to primary coil of the first transformer and the winding length ratio N2 of the primary coil to secondary coil of the second transformer are each preferably set to a value that is greater than about 1 and less than or equal to about 10.

The above-described configuration allows the multilayer directional coupler to have a multilayer structure including the first magnetic substrate, the laminate having the first and second transformers located therein, and the second magnetic substrate. Thus, by using a known production technology such as photolithography, micro-multilayer directional couplers can be mass-produced.

When the main signal is input to the input terminal of the primary coil of the first transformer, the main signal is distributed and output from the output terminal of the primary coil and the output terminal of the secondary coil of the second transformer. In this case, the distribution ratio is determined depending on the degree of electromagnetic coupling between the first and second transformers. The degree of electromagnetic coupling is determined on the basis of a winding length ratio N1 of the secondary coil to first coil of the first transformer and a winding length ratio N2 of the primary coil to secondary coil of the second transformer. Accordingly, in a preferred embodiment of the present invention, the winding length ratios N1 and N2 are each set to a value that is greater than about 1 and less than or equal to about 10.

In addition, since the first and second transformers can be formed by a known technology such as photolithography, the lengths of the coils of the first and second transformers can be pattern-formed so as to have preferable values. Accordingly, differently from the directional coupler 100 of the related art, the winding length ratios N1 and N2 of the first and second transformers can be finely and accurately set, thus enabling fine setting of the degree of electromagnetic coupling.

Further, the two ends of the primary coil of the first transformer define the input and output terminals for the main signal, one end of the secondary coil of the first transformer defines the ground terminal, and the other end of the secondary coil is connected to one terminal of the secondary coil of the second transformer. One end of a primary coil of the second transformer is connected to one terminal of the first transformer, the other end of the primary coil of the second transformer is connected to the ground terminal, and one terminal of the secondary coil of the second transformer defines the output terminal for outputting the sub-signal. Thus, the multilayer directional coupler can be used even for an apparatus that needs a signal having a bandwidth ratio equal to or greater than 90%, such as a television signal.

The ratio of the winding length ratio N2 to the winding length ratio N1 is preferably set to a value that is greater than about 0.5 and less than or equal to about 2.0.

The laminate is preferably formed by covering the first and second transformers with a non-magnetic body.

As described above in detail, preferred embodiments of the present invention provide a multilayer directional coupler which is easy to mass-produce and reduce in size, in which fine setting of the degree of electromagnetic coupling between the first and second transformers is facilitated, and which has a large bandwidth ratio.

Since the ratio of the winding length ratio N2 to the winding length ratio N1 is preferably set to a value that is greater than about 0.5 and less than or equal to about 2.0, an advantage is obtained in that a multilayer directional coupler in which the degree of electromagnetic coupling and directionality between the first and second transformers can be finely and accurately adjusted.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention are described below with reference to the drawings where like features in the different drawings are designated by like reference numbers, which may not be described in detail in every drawing.

Figure 1:
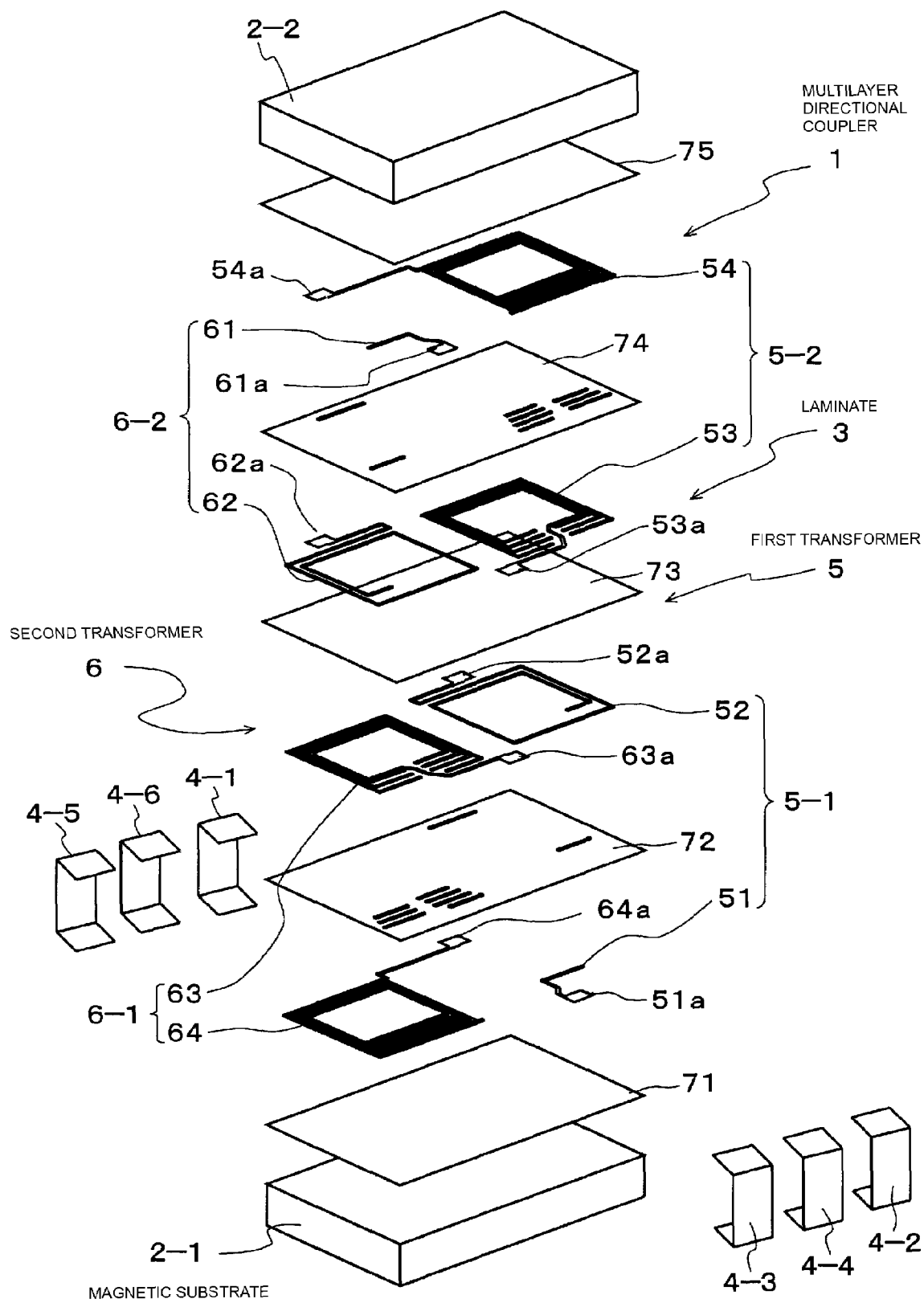
FIG. 1 is an exploded perspective view of a multilayer directional coupler according to a preferred embodiment of the present invention.
Figure 2:
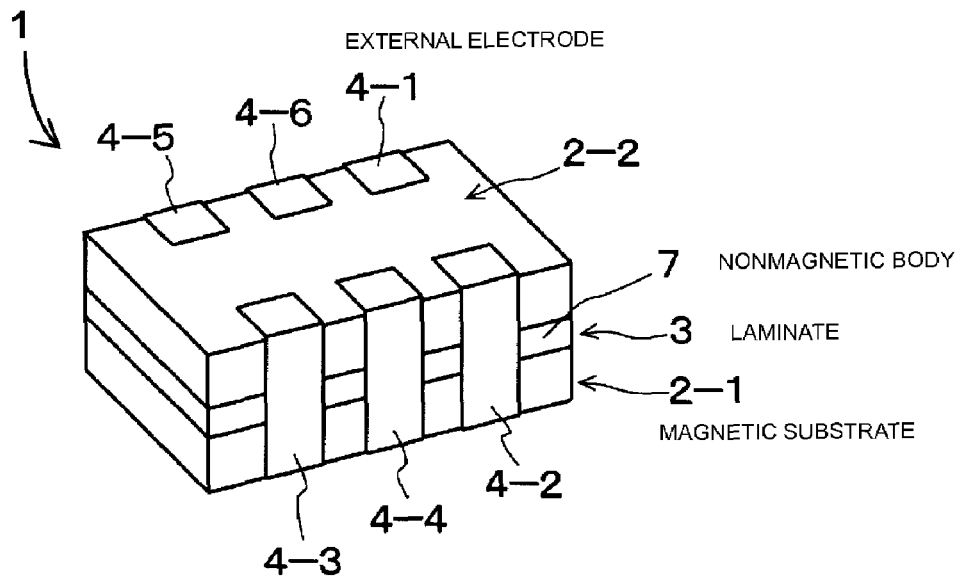
FIG. 2 is an exterior view of the multilayer directional coupler.

FIG. 1 is an exploded view of a multilayer directional coupler 1 according to a preferred embodiment of the present invention. FIG. 2 is an exterior view of the multilayer directional coupler.

As shown in FIG. 2, a multilayer directional coupler 1 according to the present preferred embodiment preferably includes a magnetic substrate 2-1 as a first magnetic substrate, a laminate 3 laminated on the magnetic substrate 2-1, a magnetic substrate 2-2 bonded as a second magnetic substrate to the laminate 3, and external electrodes 4-1, 4-2, 4-3, 4-4, 4-5, 4-6.

As shown in FIG. 1, the laminate 3 includes a first transformer 5, a second transformer 6, and a non-magnetic body 7 (see FIG. 2) that externally, completely covers the first and second transformers 5 and 6.

The non-magnetic body 7 preferably is, for example, formed of a dielectric, and formed by laminating non-magnetic layers 71, 72, 73, 74, 75. The first and second transformers 5 and 6 are pattern-formed on the non-magnetic layers 71 to 74.

Specifically, the first transformer 5 includes a primary coil 5-1 and a secondary coil 5-2 above it. The primary coil 5-1 is defined by conductor patterns 51 and 52, and the secondary coil 5-2 is defined by conductor patterns 53 and 54.

In addition, the second transformer 6 includes a primary coil 6-1 and a secondary coil 6-2 above it. The primary coil 6-1 is defined by conductor patterns 63 and 64, and a secondary coil 6-2 is defined by conductor patterns 61 and 62.

Here, structures of the first and second transformers 5 and 6 are specifically described.

The conductor patterns 51 and 64 are pattern-formed on the non-magnetic layer 71 laminated on the magnetic substrate 2-1 by a photolithography method or the like. After the non-magnetic layer 72 is laminated on the conductor patterns 51 and 64, the conductor patterns 52 and 63 are pattern-formed on the non-magnetic layer 72.

Figure 3:
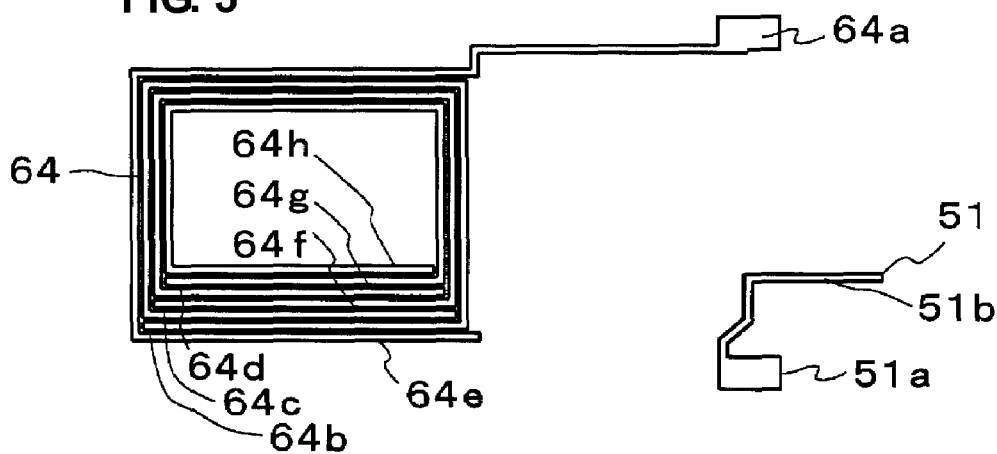
FIG. 3 is a plan view of a conductor pattern of a bottom layer.
Figure 4:
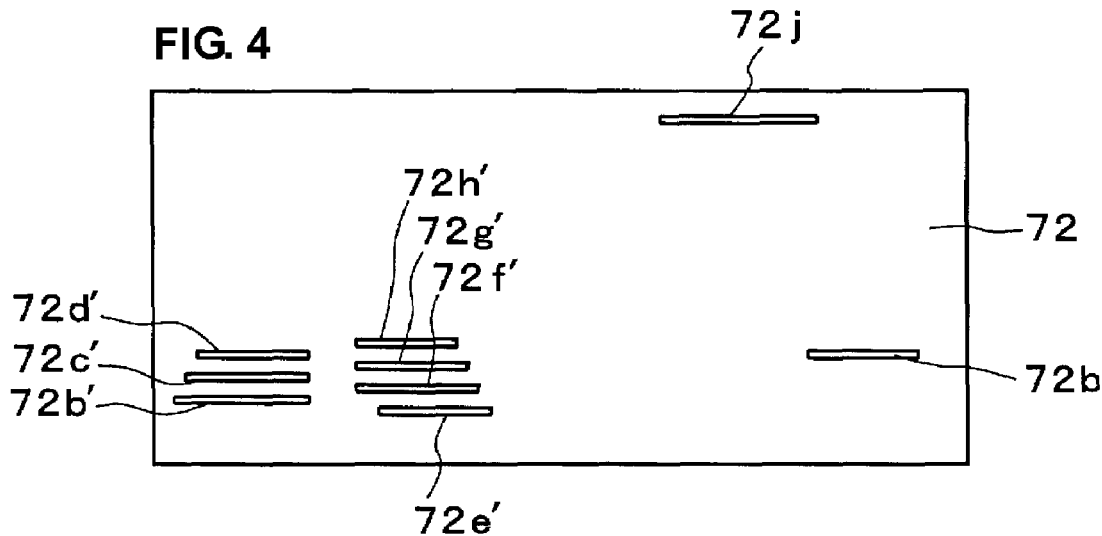
FIG. 4 is a plan view of a non-magnetic layer.
Figure 5:
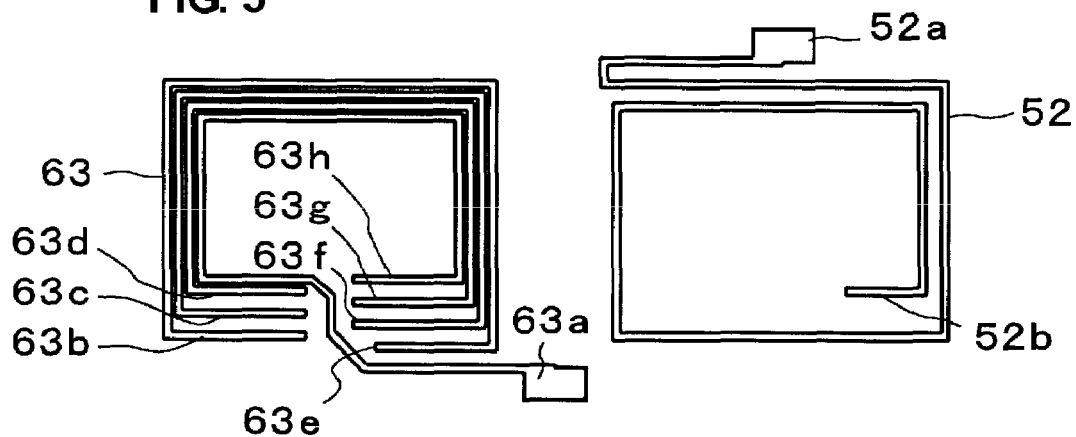
FIG. 5 is a plan view of a conductor pattern of the second layer viewed from the bottom.
Figure 6:
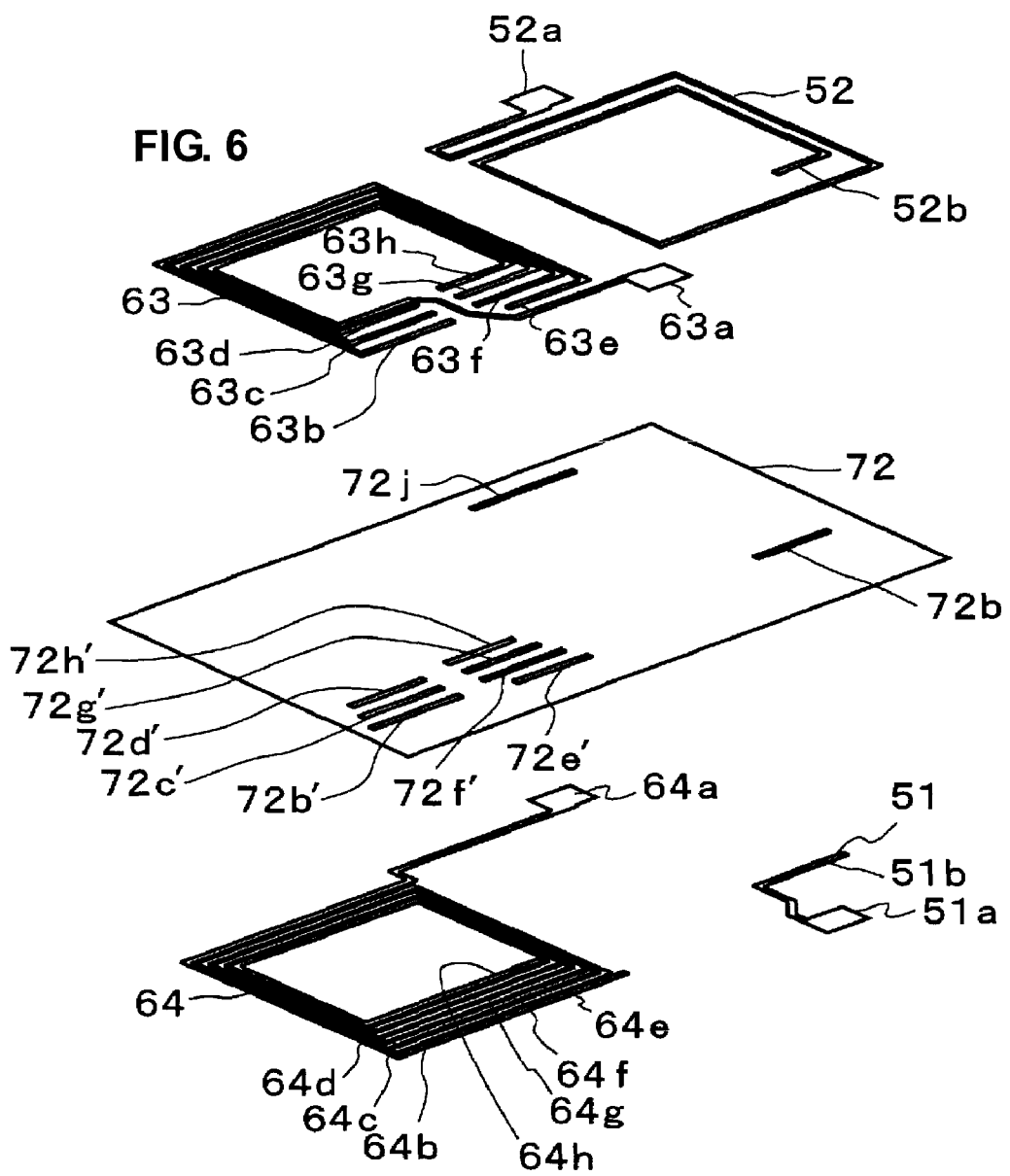
FIG. 6 is an exploded perspective view showing a connection structure of the conductor pattern of the bottom layer and the conductor pattern of the second layer.

FIG. 3 is a plan view of the conductor patterns 51 and 64. FIG. 4 is a plan view of the non-magnetic layer 72. FIG. 5 is a plan view of the conductor patterns 52 and 63. FIG. 6 is an exploded perspective view showing a connection structure of the conductor patterns 51 and 64, and the conductor patterns 52 and 63.

As shown in FIG. 3, the conductor pattern 51 includes an internal electrode 51a leading from the inside and an end portion 51b inside the pattern. As shown in FIG. 5, the conductor pattern 52 includes an internal electrode 52a leading to the outside and an inside end portion 52b.

As shown in FIG. 6, the end portion 51b of the conductor pattern 51 is connected to the end portion 52b of the conductor pattern 52 by a through hole 72b in the non-magnetic layer 72, which is shown also in FIG. 4. This defines the primary coil 5-1, which is spiral, and which uses the internal electrodes 51a and 52a as two ends of the primary coil 5-1.

In addition, as shown in FIG. 3, the conductor pattern 64 includes an internal electrode 64a leading to an outside central portion (a position corresponding to the internal electrode 52a) of the conductor pattern 51, which is next to the conductor pattern 64. Left-pointing end portions 64b, 64c, 64d and right-pointing end portions 64e, 64f, 64g, 64h are alternately arranged on a side opposite to a side on which the internal electrode 64a leads. As shown in FIG. 5, the conductor pattern 63 includes an internal electrode 63a leading from the inside up to the center between the conductor patterns 52 and 63. Pattern end portions 63b to 63d are arranged to the left of a lead of the internal electrode 63a, and end portions 63e to 63h are arranged to the right of the lead. As shown in FIG. 6, end portions 64b to 64d of the conductor pattern 64 are respectively connected to end portions 63b, 63c, 63d of the conductor pattern 63 by through holes 72b', 72c', 72d' of the non-magnetic layer 72, which are shown also in FIG. 4. Also, end portions 64e to 64h of the conductor pattern 64 are respectively connected to end portions 63e, 63f, 63g, 63h of the conductor pattern 63 by through holes 72e', 72f', 72g', 72h'. This defines the primary coil 6-1, which is spiral, and which uses the internal electrodes 64a and 63a as two ends of the primary coil 6-1.

Two leads of the internal electrodes 52a and 64a are connected by a through hole 72j in the non-magnetic layer 72, as shown in FIGS. 4 and 6.

In addition, as shown in FIG. 1, the conductor patterns 53 and 62 are pattern-formed on the non-magnetic layer 73, which is laminated on the conductor patterns 52 and 63. After the non-magnetic layer 74 is laminated on the conductor patterns 53 and 62, the conductor patterns 54 and 61 are pattern-formed on the non-magnetic layer 74.

Figure 7:
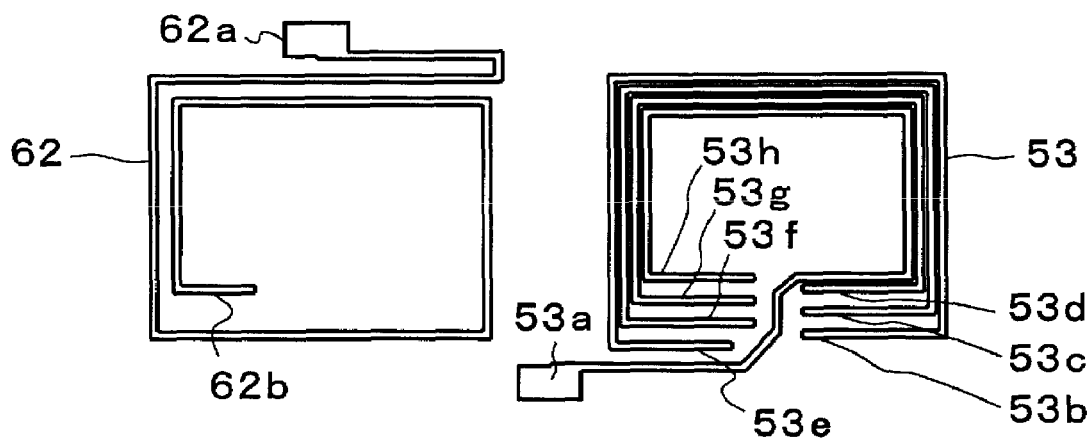
FIG. 7 is a plan view of a conductor pattern of the third layer viewed from the bottom.
Figure 8:
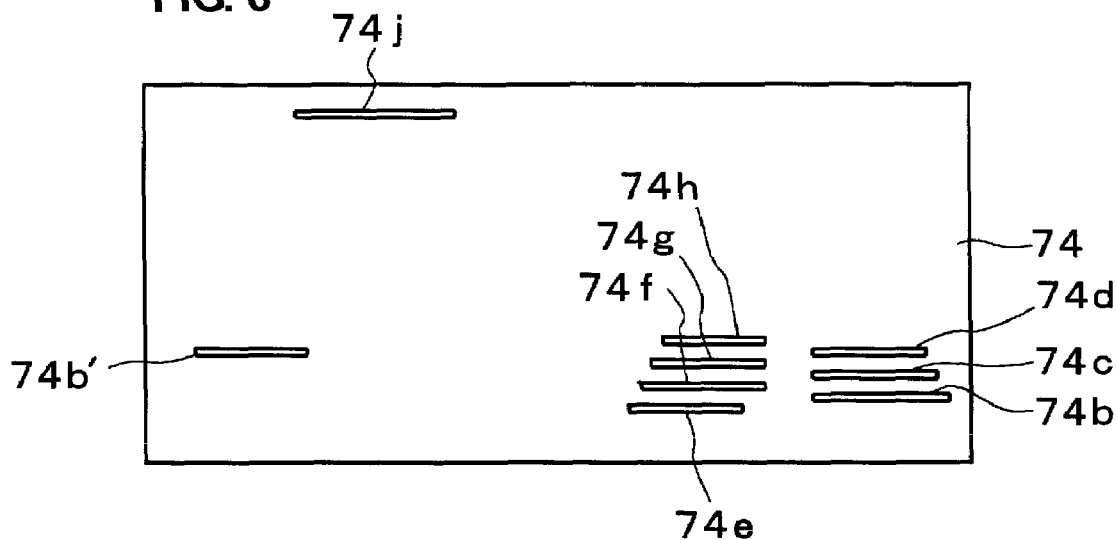
FIG. 8 is a plan view of a non-magnetic layer.
Figure 9:
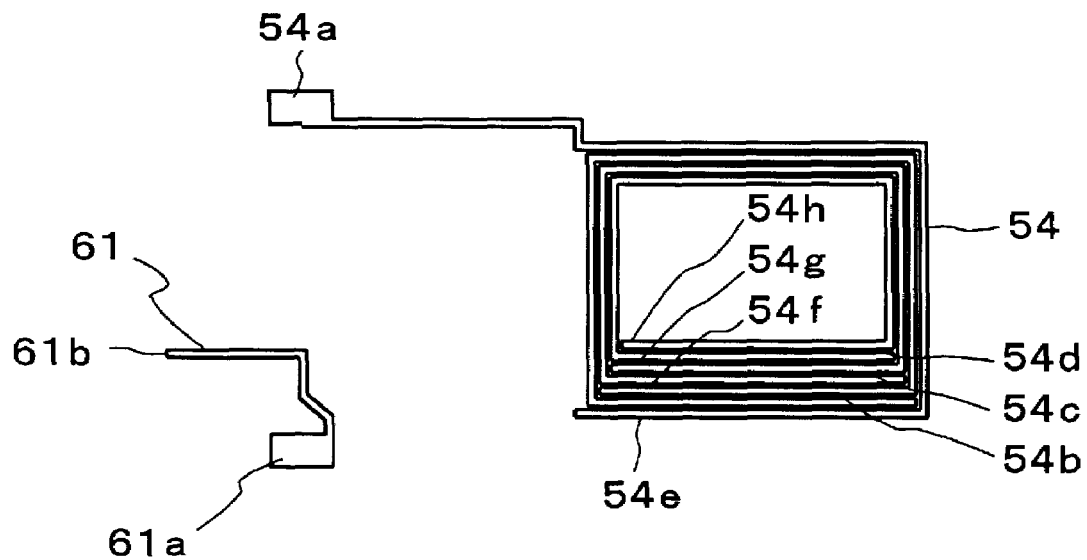
FIG. 9 is a plan view of a conductor pattern of a top layer.
Figure 10:
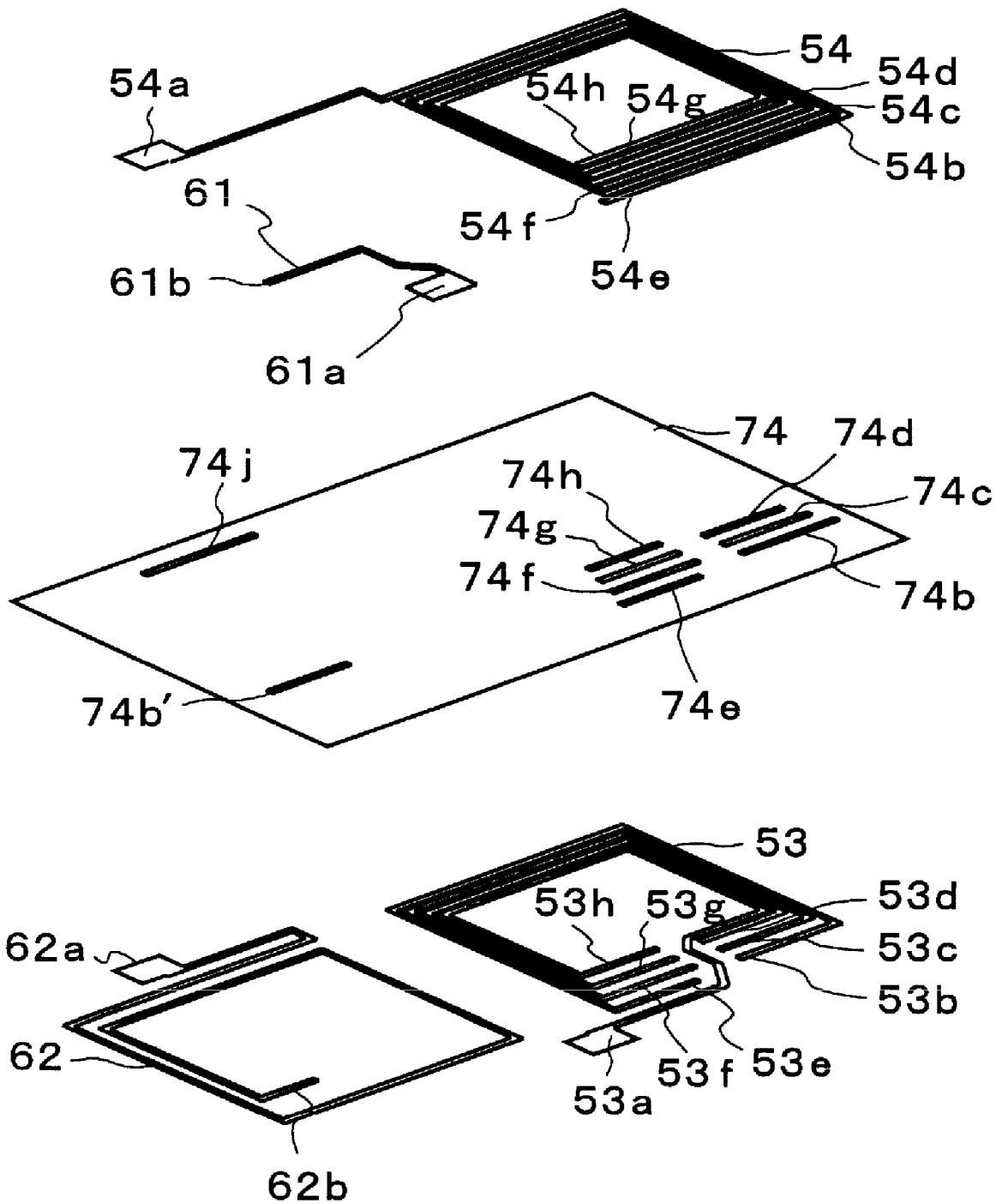
FIG. 10 is an exploded perspective view showing a connection structure of the conductor pattern of the third layer and the conductor pattern of the top layer.

FIG. 7 is a plan view of the conductor patterns 53 and 62. FIG. 8 is a plan view of the non-magnetic layer 74. FIG. 9 is a plan view of the conductor patterns 54 and 61. FIG. 10 is an exploded perspective view showing a connection structure of the conductor patterns 53 and 62, and the conductor patterns 54 and 61.

As shown in FIG. 7, the conductor pattern 53 includes an internal electrode 53a leading from the inside up to the center between the conductor patterns 53 and 62. End portions 53b, 53c, 53d are arranged to the right of a lead of the internal electrode 53a, and end portions 53e, 53f, 53g, 53h are arranged to the left of the lead. In addition, as shown in FIG. 9, the conductor pattern 54 includes an internal electrode 54a leading to an outside central portion (a position corresponding to an internal electrode 62a) of the conductor pattern 61, which is next to the internal electrode 54. Right-pointing end portions 54b to 54d and left-pointing end portions 54e, 54f, 54g, 54h are alternately arranged on a side opposite to a side on which the internal electrode 54a leads.

As shown in FIG. 10, the end portions 53b to 53d of the conductor pattern 53 are respectively connected to the end portions 54b to 54d by through holes 74b to 74d in the non-magnetic layer 74, which is shown also in FIG. 8. Also, the end portions 53e to 53h of the conductor pattern 53 are respectively connected to the end portions 54e to 54h of the conductor pattern 54 by through holes 74e, 74f, 74g, 74h. This defines the secondary coil 5-2, which is spiral, and which uses the internal electrodes 53a and 54a as two ends of the secondary coil 5-2.

In addition, as shown in FIG. 7, the conductor pattern 62 includes an internal electrode 62a leading to the outside and an end portion 62b that is inwardly positioned. Also, as shown in FIG. 9, the conductor pattern 61 includes an internal electrode 61a leading from the inside and an inward end portion 61b. As shown in FIG. 10, the end portion 62b of the conductor pattern 62 is connected to the end portion 61b of the conductor pattern 61 by a through hole 74b' in the non-magnetic layer 74, which is shown also in FIG. 8. This defines the secondary coil 6-2, which is spiral, and which uses the internal electrodes 62a and 61a as two ends of the secondary coil 6-2.

In addition, two leads of the internal electrodes 54a and 62a are connected by a through hole 74j in the non-magnetic layer 72.

As shown in FIG. 1, the non-magnetic layer 75 is laminated on the conductor patterns 54 and 61, and the magnetic substrate 2-2 is bonded to the non-magnetic layer 75.

External electrodes 4-1 to 4-6 are disposed outside the laminate 3 having the above-described structure.

This allows the external electrode 4-1 to electrically connect to both the internal electrodes 52a and 64a of the conductor patterns 52 and 64, and allows the external electrode 4-2 to electrically connect to the internal electrode 51a of the conductor pattern 51. Also, the external electrode 4-3 electrically connects to the internal electrode 61a of the conductor pattern 61. The external electrode 4-4 electrically connects to both the internal electrodes 53a and 63a of the conductor patterns 53 and 63. The external electrode 4-5 electrically connects to both the internal electrodes 54a and 62a of the conductor patterns 54 and 62.

Figure 11:
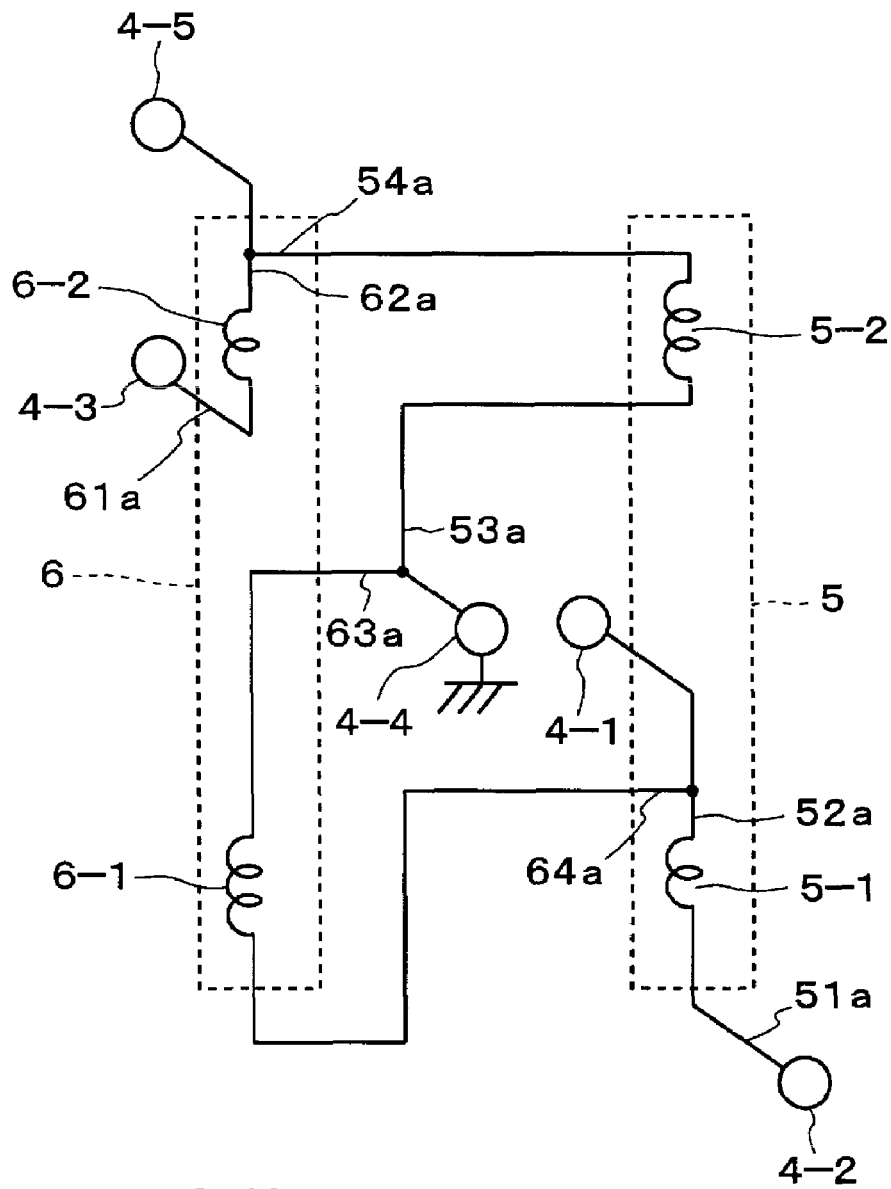
FIG. 11 is a schematic diagram showing an electrical structure of first and second transformers.

FIG. 11 is a schematic diagram showing an electrical structure of the first and second transformers 5 and 6.

On the basis of the above connections between the conductor patterns and the above connections between the external electrodes 4-1 to 4-6 and the internal electrodes, the electrical structure has the circuit structure shown in FIG. 11.

In other words, the external electrode 4-2 connected to the internal electrode 51a of the primary coil 5-1 of the first transformer 5 can be used as an input terminal for a main signal, and the external electrode 4-1 connected to the internal electrode 52a can be used as an output terminal for the main signal. The external electrode 4-4 connected to the internal electrode 53a of the secondary coil 5-2 can be used as a ground terminal. The internal electrode 64a of the primary coil 6-1 of the second transformer 6 is connected to the internal electrode 52a of the primary coil, and the internal electrode 63a is connected to the internal electrode 53a of the secondary coil 5-2 of the first transformer 5. The internal electrode 62a of the secondary coil 6-2 is connected to the internal electrode 54a of the secondary coil 5-2 of the first transformer 5. Accordingly, the external electrode 4-3 connected to the internal electrode 61a of the secondary coil 6-2 can be used as an output terminal for a sub-signal, and the external electrode 4-5 connected to both the internal electrodes 54a and 62a can be used as a terminating end by a terminating resistor or the like, which is not shown.

Figure 15:
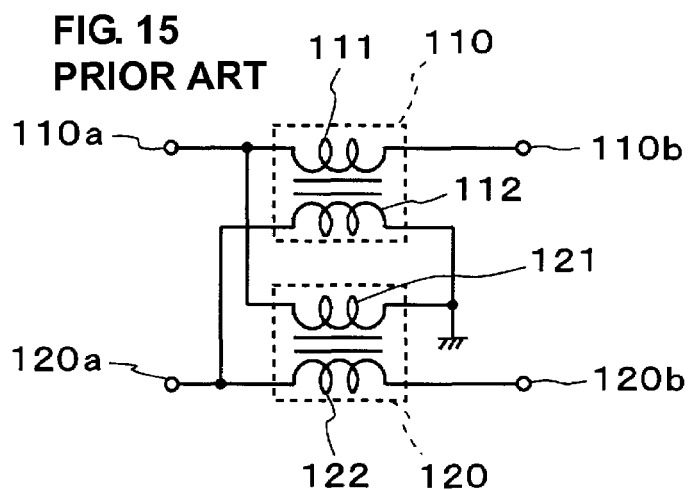
FIG. 15 is an equivalent circuit diagram of the prior art directional coupler in FIG. 14.

This circuit structure is preferably identical to a circuit structure of the directional coupler 100 shown in FIG. 15. This multilayer directional coupler has a function of distributing and outputting the main signal input from the external electrode 4-2 to the external electrode 4-1 and 4-3. Needless to say, when inputting the main signal from the external electrode 4-3, the multilayer directional coupler has a function of distributing and outputting the input main signal to the external electrodes 4-5 and 4-2.

As described above, the multilayer directional coupler has a function of distributing and outputting the main signal. The distribution ratios are determined according to the degree of electromagnetic coupling occurring between the first and second transformers, such as electromagnetic coupling between the primary and secondary coils 5-1 and 5-2 of the first transformer 5, and electromagnetic coupling between the primary and secondary coils 6-1 and 6-2 of the second transformer 6. The degree of electromagnetic coupling is dependent on the winding length ratio N1 of the secondary coil 5-2 to the primary coil 5-1 of the first transformer 5 and the winding length ratio N2 of the primary coil 6-1 to the secondary coil 6-2 of the second transformer 6.

Figure 12:
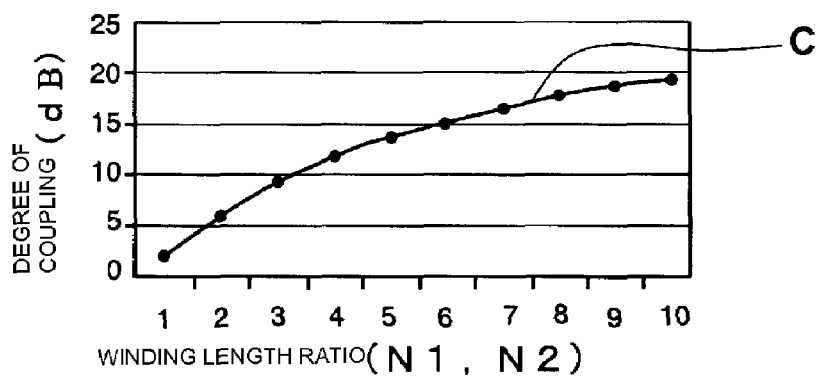
FIG. 12 is a graph showing a winging length ratio of coils and the degree of coupling between the first and second transformers.

FIG. 12 is a graph showing the winding length ratios (N1, N2) and the degree of coupling of the multilayer directional coupler. As a result of performing simulation in order to identify a range of the winding length ratios (N1, N2) at which the first and second transformers have a good degree of coupling therebetween, the present inventors obtained the results shown in FIG. 12. Specifically, it was discovered that, as indicated by curve C in FIG. 12, the degree of coupling between the first and second transformers 5 and 6 had good values of approximately 2 dB to 20 dB in a range in which a winding length ratio (1N2) was greater than or equal to about 1 and less than about 10. Accordingly, the winding length ratios N1 and N2 are preferably set so that 1<N1≦10 and 1<N2≦10.

Specifically, in this example of preferred embodiments of the present invention, the primary coil 5-1, whose winding length was about "4.2 mm" was pattern-formed, and the secondary coil 5-2, whose winding length was about "10.5 mm" was pattern-formed, with the winding length ratio N1 set to about "2.5". Also, the primary coil 6-1, whose winding length was about "4.2 mm", was pattern-formed, and the secondary coil 6-2, whose winding length was about "10.5 mm", was pattern-formed, with the winding length ratio N2 set to about "2.5". In addition, by setting a ratio (N2/N1) of the winding length ratio N2 to the winding length ratio N1 so that 0.5<N2/N1<2.0, an impedance of each port can be improved. Accordingly, in this example of the preferred embodiments, the ratio N2/N1 was set to approximately "1".

In this example of the preferred embodiments, since the first and second transformers 5 and 6 are formed by a known laminating technology such as photolithography, the primary and secondary coils 5-1 and 5-2 of the first transformer 5 and the primary and secondary coils 6-1 and 6-2 of the second transformer 6 can be pattern-formed so as to have preferable winding lengths. Accordingly, the winding length ratios N1 and N2 of the first and second transformers can be finely and accurately set.

Next, the operation and advantages exhibited by the multilayer directional coupler according to the preferred embodiments are described.

Figure 13:
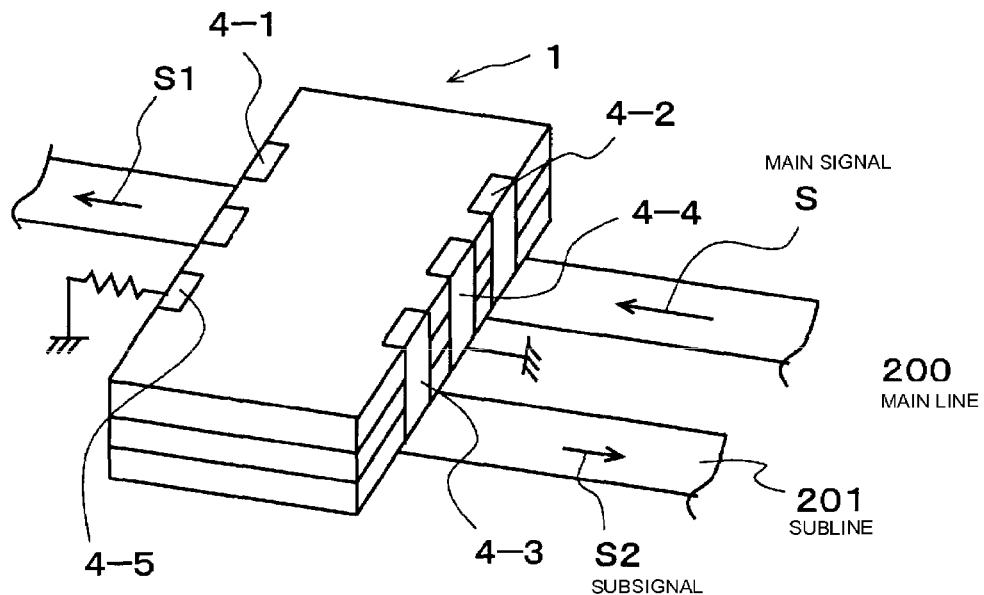
FIG. 13 is a perspective view showing a mounting state of a multilayer directional coupler.
Figure 14:
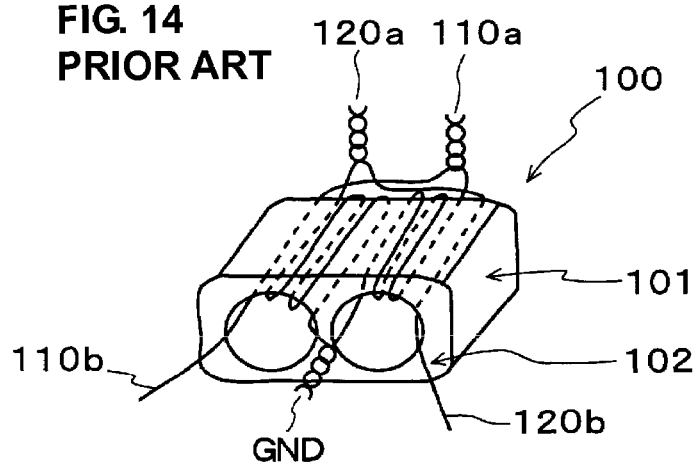
FIG. 14 is a perspective view showing an example of a directional coupler of the prior art.

As shown in FIG. 13, the external electrodes 4-1 and 4-2 are connected to end portions of a main line 200, with the external electrode 4-2 used as an input terminal for main signal S, and the external electrode 4-1 used as an output terminal. The external electrode 4-4 is set to a ground state. The external electrode 4-5 is grounded via a terminating resistor or the like, and the external electrode 4-3 is connected to a sub-line 201 and is used as an output terminal for sub-signal S2.

Accordingly, by transmitting main signal S through the main line 200, main signal S is input from the external electrode 4-2 to the multilayer directional coupler 1. Then, main signal S1 is output from the external electrode 4-1 to the main line 200, and sub-signal S2 is output from the external electrode 4-3 to the sub-line 201. In other words, main signal S input to the multilayer directional coupler 1 is distributed and output to the main line 200 and the sub-line 201 at an optimal distribution ratio corresponding to the winding length ratios N1 and N2 of the first and second transformers 5 and 6 and the ratio N2/N1.

With the first and second transformers 5 and 6 that are identical in circuit structure to the multilayer directional coupler 100 having the circuit structure in FIG. 15, main signal S can be distributed as main signal S1 and sub-signal S2 in a wide band. Thus, the multilayer directional coupler 1 can be used even for an apparatus that needs a signal having a bandwidth ratio equal to or greater than 90%, such as a television signal.

The present invention is not limited to the above-described preferred embodiments and may be variously modified and altered within the spirit of the present invention.

For example, although, in the foregoing preferred embodiments, the winding length ratio N1 (winding length ratio N2) of the secondary coil 5-2 (the primary coil 6-1) to the primary coil 5-1 (the secondary coil 6-2) of the first transformer 5 (the second transformer 6) is preferably set to about "2.5", each of the winding length ratios N1 and N2 may be a value that is greater than about 1 and less than or equal to about 10, and is not limited the value set in the foregoing preferred embodiments. In addition, although N2/N1 is preferably set to about "1", this ratio is not limited to this value since this ratio may be a value that is greater than about 0.5 and less than or equal to about 2.0.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer directional coupler comprising:
    a first magnetic substrate;
    a laminate laminated on the first magnetic substrate and including first and second transformers disposed therein, the laminate including a plurality of layers; and
    a second magnetic substrate provided on the laminate; wherein
    two ends of a primary coil of the first transformer define input and output terminals for a main signal, one end of a secondary coil of the first transformer defines a ground terminal, and the other end of the secondary coil is connected to one terminal of a secondary coil of the second transformer;
    one end of a primary coil of the second transformer is connected to one terminal of the first transformer, the other end of the primary coil of the second transformer is connected to the ground terminal, and one terminal of the secondary coil of the second transformer defines an output terminal for outputting a sub-signal;
    a winding length ratio N1 of the secondary coil to primary coil of the first transformer and a winding length ratio N2 of the primary coil to secondary coil of the second transformer are each set to a value that is greater than about 1 and less than or equal to about 10; and
    each of the primary coil and the secondary coil of the first transformer and the primary coil and the secondary coil of the second transformer includes portions disposed on at least two of the plurality of layers.

2. The multilayer directional coupler according to claim 1, wherein the ratio of the winding length ratio N2 to the winding length ratio N1 is greater than about 0.5 and less than about 2.0.

3. The multilayer directional coupler according to claim 1, wherein a non-magnetic body is arranged to cover the laminate.

* * * * *